(12) United States Patent
Masuda et al.

(10) Patent No.: US 12,148,649 B2
(45) Date of Patent: Nov. 19, 2024

(54) PROCESSING APPARATUS AND WORKPIECE PROCESSING METHOD

(71) Applicant: DISCO CORPORATION, Tokyo (JP)

(72) Inventors: Yukiyasu Masuda, Tokyo (JP); Kentaro Odanaka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/836,618

(22) Filed: Jun. 9, 2022

(65) Prior Publication Data

US 2022/0301918 A1    Sep. 22, 2022

Related U.S. Application Data

(62) Division of application No. 16/848,344, filed on Apr. 14, 2020, now Pat. No. 11,393,709.

(30) Foreign Application Priority Data

Apr. 18, 2019   (JP) .................................. 2019-079162

(51) Int. Cl.
  *H01L 21/68*   (2006.01)
  *H01L 21/67*   (2006.01)
  *H01L 21/683*  (2006.01)

(52) U.S. Cl.
  CPC .... *H01L 21/6833* (2013.01); *H01L 21/67242* (2013.01); *H01L 21/6838* (2013.01)

(58) Field of Classification Search
  CPC ........... H01L 21/6833; H01L 21/67242; H01L 21/6838; H01L 21/67092; H01L 21/681; H01L 21/78; H01L 22/12
  See application file for complete search history.

(56) References Cited

U.S. PATENT DOCUMENTS

| 5,321,352 A | * | 6/1994 | Takebuchi | ......... G01R 1/07314 |
| | | | | 324/750.19 |
| 2007/0084838 A1 | * | 4/2007 | Hsu | ....................... B23K 26/38 |
| | | | | 219/121.72 |

(Continued)

FOREIGN PATENT DOCUMENTS

| CN | 101318264 A | 12/2008 |
| JP | 06232255 A | 8/1994 |

(Continued)

OTHER PUBLICATIONS

Office Action issued in counterpart German patent application No. 10 2020 204 896.7, dated Sep. 27, 2023.

(Continued)

*Primary Examiner* — Mohammed Shamsuzzaman
(74) *Attorney, Agent, or Firm* — GREER BURNS & CRAIN, LTD.

(57) ABSTRACT

A workpiece processing method for processing a workpiece using a processing apparatus including a chuck table, a processing unit, a moving mechanism for moving the chuck table and the processing unit relative to each other, and an imaging unit for imaging the workpiece, where the chuck table includes a holding member formed by a transparent body and a supporting member supporting a part of the holding member and connected to an angle control mechanism. The method includes a tape affixing step, a holding step of holding the workpiece by the chuck table via the tape, and an identifying step of imaging the top surface side of the workpiece through the transparent holding member by the imaging unit positioned in a region that is on a lower side of the holding member and is not superimposed on the supporting member, and identifying a region to be processed in the workpiece.

18 Claims, 9 Drawing Sheets

(56) References Cited

U.S. PATENT DOCUMENTS

| | | | | |
|---|---|---|---|---|
| 2007/0251449 | A1* | 11/2007 | Mizuno | H01L 21/6715 257/E21.259 |
| 2009/0085594 | A1* | 4/2009 | Yamamoto | G01R 31/2891 324/762.05 |
| 2011/0132885 | A1* | 6/2011 | Sercel | B23K 26/0738 219/121.72 |
| 2014/0311653 | A1* | 10/2014 | Nakamura | H01L 21/68 156/64 |
| 2016/0125591 | A1* | 5/2016 | Kudo | G06T 7/001 382/141 |
| 2017/0140989 | A1* | 5/2017 | Tabuchi | H01L 21/268 |
| 2018/0161920 | A1* | 6/2018 | Nomura | B23K 26/359 |
| 2018/0211852 | A1* | 7/2018 | Ban | H01L 21/67092 |
| 2018/0214986 | A1* | 8/2018 | Ban | H01L 21/67288 |
| 2019/0035689 | A1* | 1/2019 | Yamamoto | H01L 21/3043 |
| 2019/0101443 | A1* | 4/2019 | Odanaka | G01J 1/0437 |
| 2020/0185227 | A1* | 6/2020 | Wakahara | H01L 21/308 |
| 2020/0269444 | A1* | 8/2020 | Kodama | B25J 15/08 |
| 2021/0098298 | A1* | 4/2021 | Kai | H01L 21/78 |
| 2021/0170524 | A1* | 6/2021 | Obata | B23K 26/0665 |

FOREIGN PATENT DOCUMENTS

| | | | | |
|---|---|---|---|---|
| JP | 2008012566 | A * | 1/2008 | H01L 21/78 |
| JP | 2010082644 | A | 4/2010 | |
| JP | 2010087141 | A | 4/2010 | |
| JP | 2012232316 | A | 11/2012 | |
| JP | 2012256749 | A | 12/2012 | |
| JP | 2014225691 | A | 12/2014 | |
| JP | 6490771 | B1 | 3/2019 | |

OTHER PUBLICATIONS

Search Report issued in counterpart Singapore patent application No. 10202002979R, dated Mar. 10, 2021.

Office Action issued in Japanese Patent Application No. 12019-079162, dated Jan. 31, 2023.

* cited by examiner

PROCESSING APPARATUS AND WORKPIECE PROCESSING METHOD

This application is a divisional of application Ser. No. 16/848,344, filed Apr. 14, 2020.

BACKGROUND OF THE INVENTION

Field of the Invention

The present invention relates to a processing apparatus that processes a workpiece and a workpiece processing method using the processing apparatus.

Description of the Related Art

A device chip manufacturing process uses a wafer having devices such as intergrated circuits (ICs) or large scale integrations (LSIs) formed in each of a plurality of regions demarcated by planned dividing lines (streets). A plurality of device chips each having the device are obtained by dividing the wafer along the planned dividing lines.

For dividing the wafer, a cutting apparatus which, for example, includes a chuck table holding the wafer and a processing unit (cutting unit) fitted with an annular cutting blade that cuts the wafer held by the chuck table is used. The wafer is divided into a plurality of device chips by making the cutting blade rotate and cut into the wafer. In addition, a method of dividing the wafer using a laser processing apparatus has recently been used. The laser processing apparatus includes a chuck table holding the wafer and a processing unit (laser applying unit) processing the wafer by irradiating the wafer held by the chuck table with a laser beam. For example, there has been proposed a method which forms a modified region (modified layer) within the wafer along the planned dividing lines by condensing a laser beam transmissible through the wafer to the inside of the wafer. The region in which this modified layer is formed is more fragile than other regions of the wafer. Therefore, when an external force is applied to the wafer in which the modified layer is formed, the wafer is divided along the planned dividing lines with the modified layer as a starting point.

When the wafer is to be processed by a processing apparatus typified by the cutting apparatus and the laser processing apparatus described above, the wafer is disposed on the holding surface of the chuck table, and then the position of a region to be processed (processing target region) in the wafer is detected by imaging the top surface side of the wafer having the devices formed thereon by an imaging unit such as a camera. Then, on the basis of the detected position of the processing target region, alignment which adjusts positional relation between the wafer and the processing unit is performed. Incidentally, depending on the content of the processing, the processing may be performed in a state in which the top surface side of the wafer is opposed to the holding surface of the chuck table and the undersurface side of the wafer is exposed upward. In this case, the top surface side (lower surface side) of the wafer is covered by the holding surface of the chuck table. It is therefore difficult to image the top surface side of the wafer by the imaging unit. As a result, the processing target region cannot be detected on the basis of the positions of the devices formed on the top surface side of the wafer or the like.

Accordingly, there has been proposed a processing apparatus which makes it possible to observe the top surface side of the wafer even in a state in which the top surface side of the wafer having the devices formed thereon is covered by the holding surface of the chuck table. For example, Japanese Patent Laid-Open No. H06-232255 discloses a cutting apparatus including an infrared lamp that applies infrared rays that pass through the wafer. In this cutting apparatus, the infrared rays applied from the infrared lamp to the undersurface side of the wafer pass through the wafer and reach the top surface side of the wafer. Then, a pattern on the top surface side of the wafer is observed by detecting the infrared rays reflected by the top surface side of the wafer. In addition, Japanese Patent Laid-Open No. 2010-82644 and Japanese Patent Laid-Open No. 2010-87141 disclose a laser processing apparatus including a chuck table formed by a transparent member and imaging means disposed on the lower side of the chuck table. In this laser processing apparatus, the top surface side of the wafer is imaged from the lower side of the wafer through the transparent chuck table even in the case where the top surface side of the wafer is covered by the holding surface of the chuck table.

SUMMARY OF THE INVENTION

The use of the cutting apparatus including the above-described infrared lamp makes it possible to image the top surface side (lower surface side) of the wafer and to detect the processing target region on the basis of the positions of the devices formed on the top surface side of the wafer or the like, even when the top surface side of the wafer is covered by the holding surface of the chuck table. However, the imaging of the top surface side of the wafer is obstructed when a layer not transmitting infrared rays (metallic layer or the like) is formed on the undersurface side of the wafer or within the wafer, for example.

On the other hand, in the laser processing apparatus including the transparent chuck table, the imaging means disposed on the lower side of the chuck table images the top surface side of the wafer through the chuck table. Therefore, the devices and the like formed on the top surface side of the wafer can be imaged even when a metallic layer or the like is formed on the undersurface side of the wafer or within the wafer. However, in this laser processing apparatus, a moving mechanism that controls the position of the imaging means in a horizontal direction may be installed, and a rotating mechanism that rotates the chuck table may be installed on a side of the chuck table. It is therefore necessary to secure a region for arranging the moving mechanism and the rotating mechanism within the processing apparatus, resulting in an increased size of the apparatus.

The present invention has been made in view of such problems. It is an object of the present invention to provide a processing apparatus that makes it possible to observe the lower surface side of a workpiece held by a chuck table and to decrease the size of the apparatus and a workpiece processing method using the processing apparatus.

In accordance with an aspect of the present invention, there is provided a processing apparatus including a chuck table configured to hold a workpiece by a holding surface, a processing unit configured to process the workpiece held by the chuck table; a moving mechanism configured to move the chuck table and the processing unit relative to each other along a direction parallel with the holding surface of the chuck table, an angle control mechanism disposed on the moving mechanism and on a lower side of the chuck table, the angle control mechanism controlling an angle of the chuck table; and an imaging unit configured to image the workpiece held by the chuck table, the chuck table including a holding member formed by a transparent body and holding the workpiece and a supporting member supporting a part of the holding member and connected to the angle control mechanism, the processing apparatus moving the chuck table by the moving mechanism and imaging the workpiece through the holding member by the imaging unit in a state in which the imaging unit is positioned in a region that is on a lower side of the holding member and is not superimposed on the supporting member.

Incidentally, preferably, the angle control mechanism is a rotating mechanism that rotates the chuck table. In addition, preferably, the chuck table further includes an outer circumference holding member configured to hold an outer circumferential portion of the holding member, and the outer circumference holding member is supported by the supporting member. Further, preferably, the processing apparatus further includes an upper side imaging unit configured to image the workpiece held by the chuck table, from an upper side of the holding member. Moreover, preferably, the processing apparatus further includes a positioning member to which a target for performing positioning between the imaging unit and the upper side imaging unit is set, and the target is imaged by the imaging unit positioned on the lower side of the holding member and the upper side imaging unit positioned on the upper side of the holding member. Furthermore, preferably, the processing apparatus further includes a moving mechanism configured to move the imaging unit along a direction perpendicular to the holding surface of the chuck table.

In accordance with another aspect of the present invention, there is provided a workpiece processing method for processing a workpiece by using a processing apparatus, the processing apparatus including a chuck table configured to hold the workpiece by a holding surface, a processing unit configured to process the workpiece held by the chuck table, a moving mechanism configured to move the chuck table and the processing unit relative to each other along a direction parallel with the holding surface of the chuck table, an angle control mechanism disposed on the moving mechanism and on a lower side of the chuck table, the angle control mechanism controlling an angle of the chuck table, and an imaging unit configured to image the workpiece held by the chuck table, the chuck table including a holding member formed by a transparent body and holding the workpiece and a supporting member supporting a part of the holding member and connected to the angle control mechanism, the workpiece processing method including a tape affixing step of affixing a tape to a top surface side of the workpiece, a holding step of holding the workpiece by the chuck table via the tape after the tape affixing step; an identifying step of, after the holding step, imaging the top surface side of the workpiece through the holding member by the imaging unit positioned in a region that is on a lower side of the holding member and is not superimposed on the supporting member, and identifying a region to be processed in the workpiece, a processing step of cutting the workpiece along the region to be processed, by the processing unit after the identifying step, a detecting step of, after the processing step, imaging the top surface side of the workpiece through the holding member by the imaging unit positioned in the region that is on the lower side of the holding member and is not superimposed on the supporting member, and detecting a difference between a position of the region to be processed and a position of a processing trace formed in the processing step, and a position correcting step of correcting a position to be processed by the processing unit on the basis of the difference between the position of the region to be processed and the position of the processing trace.

In accordance with another aspect of the present invention, there is provided a workpiece processing method for processing a workpiece by using a processing apparatus, the processing apparatus including a chuck table configured to hold the workpiece by a holding surface, a processing unit configured to process the workpiece held by the chuck table, a moving mechanism configured to move the chuck table and the processing unit relative to each other along a direction parallel with the holding surface of the chuck table, an angle control mechanism disposed on the moving mechanism and on a lower side of the chuck table, the angle control mechanism controlling an angle of the chuck table, and a first imaging unit and a second imaging unit configured to image the workpiece held by the chuck table, the chuck table including a holding member formed by a transparent body and holding the workpiece and a supporting member supporting a part of the holding member and connected to the angle control mechanism, the workpiece processing method including a holding step of holding the workpiece by the chuck table such that a top surface side of the workpiece is opposed to an upper surface of the holding member, an identifying step of, after the holding step, imaging the top surface side of the workpiece through the holding member by the first imaging unit positioned in a region that is on a lower side of the holding member and is not superimposed on the supporting member, and identifying a region to be processed in the workpiece, a processing step of, after the identifying step, forming a processed groove along the region to be processed, on an undersurface side of the workpiece by the processing unit, a detecting step of, after the processing step, imaging the processed groove by the second imaging unit positioned on an upper side of the holding member, and detecting a difference between a position of the region to be processed and a position of the processed groove, and a position correcting step of correcting a position to be processed by the processing unit on the basis of the difference between the position of the region to be processed and the position of the processed groove.

The processing apparatus according to one aspect of the present invention can image the workpiece through the holding member by the imaging unit in a state in which the imaging unit is positioned in a region that is on the lower side of the holding member and is not superimposed on the supporting member, by moving the chuck table by the moving mechanism. It is thus possible to perform positioning between the imaging unit and the holding member without separately providing a moving mechanism for moving the imaging unit in a horizontal direction. The processing apparatus can therefore be miniaturized. In addition, in the above-described processing apparatus, the angle control mechanism is disposed on the lower side of the chuck table. Therefore, the installation area of the processing apparatus is reduced as compared with a structure in which the angle control mechanism is disposed on a side of the chuck table, for example.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
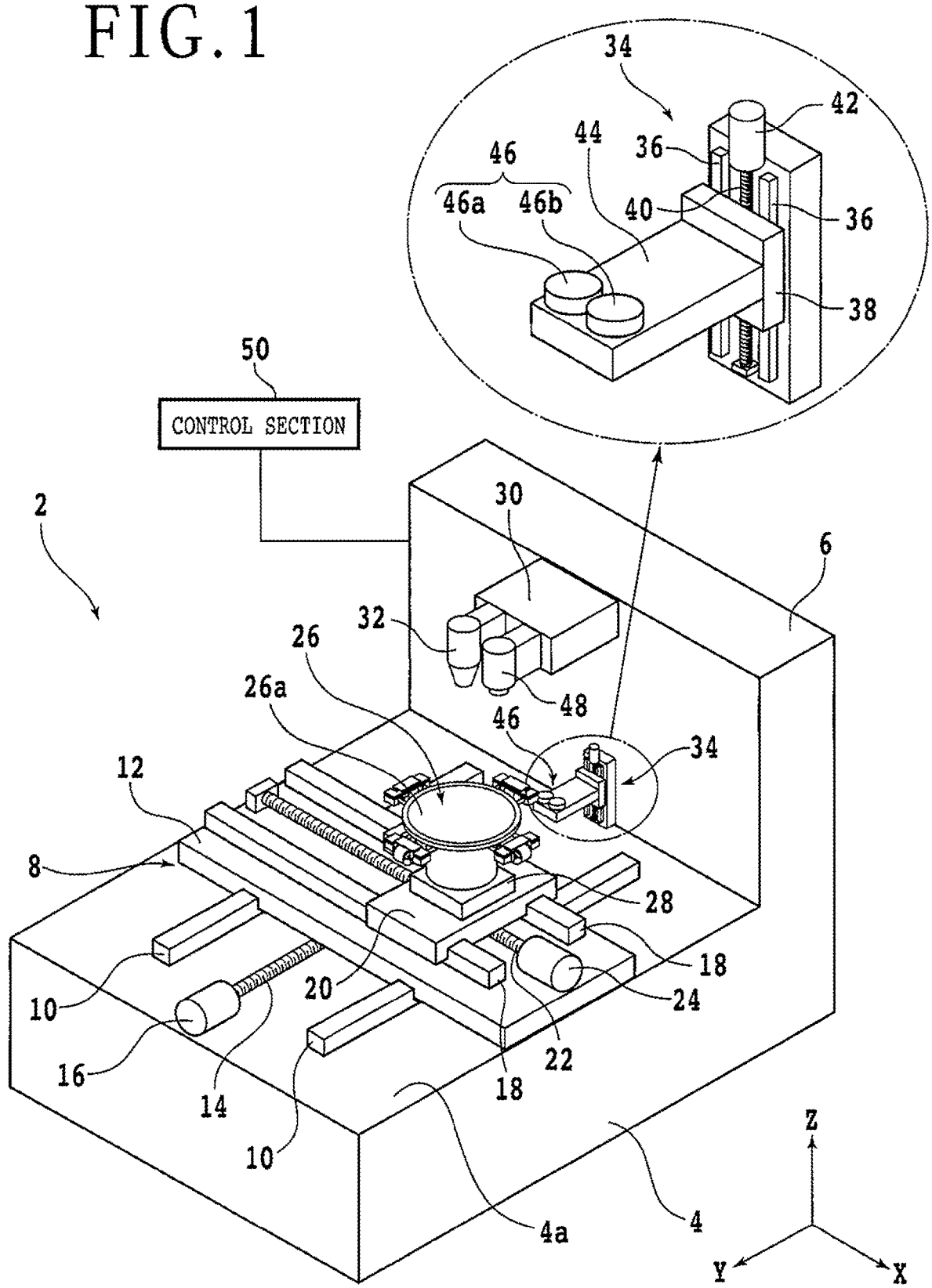
FIG. 1 is a perspective view depicting a laser processing apparatus.

An embodiment according to one aspect of the present invention will hereinafter be described with reference to the accompanying drawings. FIG. 1 is a perspective view depicting a laser processing apparatus 2 as an example of configuration of a processing apparatus according to the present embodiment.

The laser processing apparatus 2 includes a base 4 supporting each constituent element constituting the laser processing apparatus 2. A top surface (upper surface) 4a of the base 4 is formed substantially parallel with an X-axis direction (first horizontal direction) and a Y-axis direction (second horizontal direction). In addition, in the base 4, a supporting structure 6 in a rectangular parallelepipedic shape is disposed along a Z-axis direction (a vertical direction or an upward-downward direction).

A moving mechanism (moving unit) 8 is provided on the top surface 4a of the base 4. The moving mechanism 8 includes a pair of Y-axis guide rails 10 arranged substantially in parallel with the Y-axis direction. A Y-axis moving table 12 is mounted on the pair of Y-axis guide rails 10 in a state of being slidable along the Y-axis guide rails 10. A nut portion (not depicted) is provided on the undersurface (lower surface) side of the Y-axis moving table 12. A Y-axis ball screw 14 disposed substantially in parallel with the pair of Y-axis guide rails 10 is screwed into the nut portion. In addition, a Y-axis pulse motor 16 is coupled to one end portion of the Y-axis ball screw 14. When the Y-axis ball screw 14 is rotated by the Y-axis pulse motor 16, the Y-axis moving table 12 moves in the Y-axis direction along the pair of Y-axis guide rails 10.

A pair of X-axis guide rails 18 arranged substantially in parallel with the X-axis direction is provided on the top surface (upper surface) side of the Y-axis moving table 12.

An X-axis moving table 20 is mounted on the pair of X-axis guide rails 18 in a state of being slidable along the X-axis guide rails 18. A nut portion (not depicted) is provided on the undersurface (lower surface) side of the X-axis moving table 20. An X-axis ball screw 22 disposed substantially in parallel with the pair of X-axis guide rails 18 is screwed into the nut portion. In addition, an X-axis pulse motor 24 is coupled to one end portion of the X-axis ball screw 22. When the X-axis ball screw 22 is rotated by the X-axis pulse motor 24, the X-axis moving table 20 moves in the X-axis direction along the pair of X-axis guide rails 18.

A chuck table (holding table) 26 for holding a workpiece 11 (see FIG. 2A) is disposed on the top surface (upper surface) side of the X-axis moving table 20. The upper surface of the chuck table 26 constitutes a holding surface 26a holding the workpiece 11. The holding surface 26a is connected to a suction source (not depicted) via a suction passage (not depicted) formed within the chuck table 26. The workpiece 11 is held under suction by the chuck table 26 by making a negative pressure of the suction source act on the holding surface 26a in a state in which the workpiece 11 is disposed on the holding surface 26a of the chuck table 26.

Figure 2A:
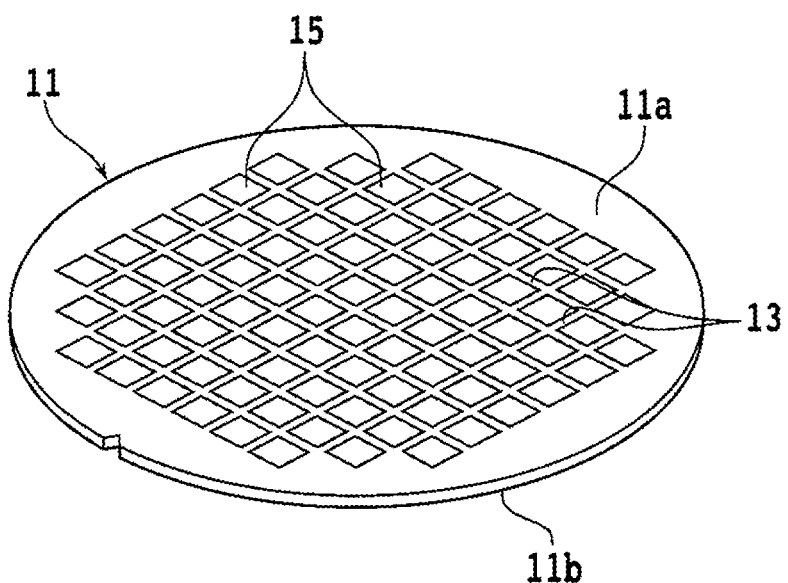
FIG. 2A is a perspective view depicting a workpiece.

FIG. 2A is a perspective view depicting the workpiece 11. The workpiece 11 is, for example, a wafer made of silicon or the like and formed in a disk shape. The workpiece 11 has a top surface 11a and an undersurface 11b. The workpiece 11 is divided into a plurality of regions by planned dividing lines (streets) 13 arranged in a lattice manner so as to intersect each other. The regions each have a device 15 such as an IC, an LSI, or an LED (Light Emitting Diode) formed on the top surface 11a side of the regions. Incidentally, the material, shape, structure, size, and the like of the workpiece 11 are not limited. For example, the workpiece 11 may be a wafer formed of a material such as a semiconductor (GaAs, InP, GaN, SiC, or the like) other than silicon, sapphire, glass, ceramic, resin, or metal and having any shape and size. In addition, the type, quantity, shape, structure, size, arrangement, and the like of the devices 15 are not limited either.

Figure 2B:
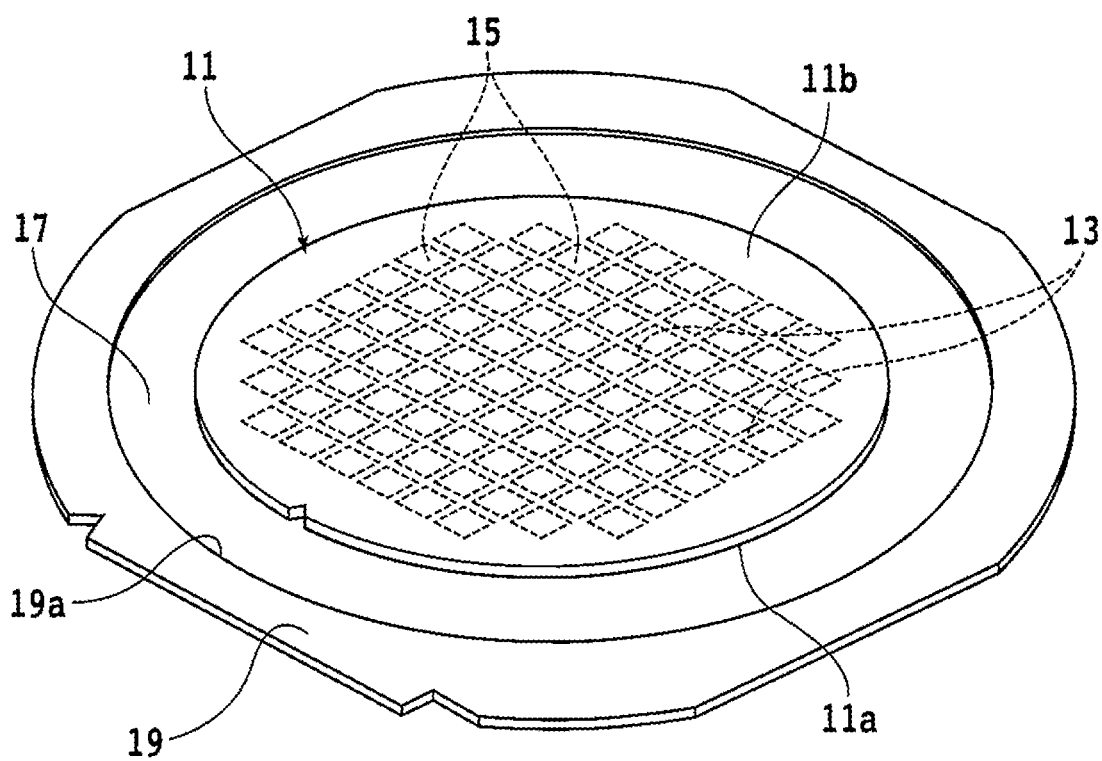
FIG. 2B is a perspective view depicting the workpiece supported by a frame.

In addition, the workpiece 11 may be supported by an annular frame for convenience in processing and conveyance. FIG. 2B is a perspective view depicting the workpiece 11 supported by an annular frame 19. A circular tape 17 having a larger diameter than the workpiece 11 is affixed to the top surface 11a side of the workpiece 11. Thus, the top surface 11a side of the workpiece 11 is covered by the tape 17, and the plurality of devices 15 are protected by the tape 17. Incidentally, the material of the tape 17 is not limited. The tape 17 is, for example, a flexible film obtained by forming a rubber-based or acrylic-based adhesive layer (glue layer) on a base material formed of a resin such as polyolefin, polyvinyl chloride, or polyethylene terephthalate. An outer circumferential portion of the tape 17 is affixed to the annular frame 19 having a circular opening 19a of a larger diameter than the workpiece 11 in a central portion of the annular frame 19. The workpiece 11 is thereby supported by the frame 19 via the tape 17 in a state of being disposed inside the opening 19a.

As depicted in FIG. 1, an angle control mechanism (angle control unit) 28 that controls the angle of the chuck table 26 in a horizontal direction (XY plane direction) is provided on the lower side of the chuck table 26. The angle control mechanism 28 is provided on the X-axis moving table 20 of the moving mechanism 8. The lower end side of the chuck table 26 is connected to the angle control mechanism 28. The angle control mechanism 28 is, for example, formed by a rotating mechanism (rotating unit) that rotates the chuck table 26. The rotating mechanism has a rotation driving source such as a motor. The rotating mechanism rotates the chuck table 26 about a rotational axis substantially parallel with the Z-axis direction. The angle of the chuck table 26 in the horizontal direction is thereby controlled.

The moving mechanism 8 controls the positions of the chuck table 26 and the angle control mechanism 28 in a direction parallel with the holding surface 26*a* of the chuck table 26 (horizontal direction). Specifically, when the X-axis moving table 20 is moved along the X-axis direction, the chuck table 26 and the angle control mechanism 28 move along the X-axis direction. In addition, when the Y-axis moving table 12 is moved along the Y-axis direction, the chuck table 26 and the angle control mechanism 28 move along the Y-axis direction. Incidentally, the moving mechanism 8 is provided with an X-axis detecting unit (not depicted) detecting the position of the X-axis moving table 20 in the X-axis direction and a Y-axis detecting unit (not depicted) detecting the position of the Y-axis moving table 12 in the Y-axis direction. The X-axis detecting unit and the Y-axis detecting unit identify the position of the chuck table 26 in the horizontal direction.

In addition, the laser processing apparatus 2 includes a columnar supporting arm 30 that projects forward from the front surface side of the supporting structure 6. Disposed at an end portion of the supporting arm 30 is a processing unit (laser irradiating unit) 32 that processes the workpiece 11 by irradiating the workpiece 11 held by the chuck table 26 with a laser beam. The processing unit 32 includes a laser oscillator (not depicted) such as a YAG laser or a YVO$_4$ laser and a condenser (not depicted) that condenses the laser beam oscillated from the laser oscillator. Incidentally, the wavelength of the laser beam applied from the processing unit 32 is not limited and is set as appropriate according to the purpose of laser processing. For example, when the workpiece 11 is subjected to ablation processing, the wavelength of the laser beam is set such that at least a part of the laser beam is absorbed by the workpiece 11. In this case, a laser beam absorbable by the workpiece 11 is applied. In addition, the condenser condenses the laser beam oscillated from the laser oscillator to a predetermined position of the workpiece 11 held by the chuck table 26.

The workpiece 11 is subjected to laser processing by application of the laser beam from the processing unit 32 to the chuck table 26 in a state in which the chuck table 26 holds the workpiece 11. Incidentally, the movement and angle of the chuck table 26 at a time of the application of the laser beam are controlled according to the shape of a region to be processed (processing target region) in the workpiece 11. Specifically, the moving mechanism 8 moves the chuck table 26 and the processing unit 32 relative to each other along a direction parallel with the holding surface 26*a* of the chuck table 26. In addition, the angle control mechanism 28 adjusts the angle of the chuck table 26 by rotating the chuck table 26, for example. The workpiece 11 is, for example, divided along the planned dividing lines 13 by ablation processing using the processing unit 32. In this case, a processing trace (cut groove) 11*c* (see FIG. 6A) reaching the undersurface 11*b* from the top surface 11*a* is formed in the workpiece 11 along the planned dividing lines 13. In addition, a processed groove 11*d* (see FIG. 7A) having a depth less than the thickness of the workpiece 11 can also be formed on the undersurface 11*b* side of the workpiece 11 along the planned dividing lines 13 by ablation processing.

In addition, a moving mechanism (moving unit) 34 fixed to the front surface side of the supporting structure 6 is provided below the supporting arm 30. The moving mechanism 34 includes a pair of Z-axis guide rails 36 arranged substantially in parallel with the Z-axis direction. A tabular Z-axis moving plate 38 is slidably mounted on the pair of Z-axis guide rails 36. A nut portion (not depicted) is provided to a side of the Z-axis moving plate 38 facing the Z-axis guide rails 36. A Z-axis ball screw 40 disposed substantially in parallel with the pair of Z-axis guide rails 36 is screwed into the nut portion. A Z-axis pulse motor 42 is coupled to one end portion of the Z-axis ball screw 40. When the Z-axis ball screw 40 is rotated by the Z-axis pulse motor 42, the Z-axis moving plate 38 moves in the Z-axis direction along the pair of Z-axis guide rails 36.

A columnar supporting arm 44 projecting forward from the Z-axis moving plate 38 is fixed to the front surface side of the Z-axis moving plate 38. In addition, an imaging unit (a lower side imaging unit or a first imaging unit) 46 imaging the workpiece 11 held by the chuck table 26, from a lower side, is provided to an upper surface side of an end portion (front end portion) of the supporting arm 44. FIG. 1 depicts an example in which the imaging unit 46 is formed by a low magnification camera 46*a* and a high magnification camera 46*b*. The imaging unit 46 may perform imaging by using one of the low magnification camera 46*a* and the high magnification camera 46*b* or may perform imaging by using both the low magnification camera 46*a* and the high magnification camera 46*b*. Each of the low magnification camera 46*a* and the high magnification camera 46*b* is, for example, formed by a visible light camera, an infrared camera, or the like. The moving mechanism 34 moves the imaging unit 46 along a direction perpendicular to the holding surface 26*a* of the chuck table 26 (Z-axis direction). The height (position in the Z-axis direction) of the imaging unit 46 is thereby controlled.

In addition, an imaging unit (an upper side imaging unit or a second imaging unit) 48 imaging the workpiece 11 held by the chuck table 26, from an upper side, is installed at a position adjacent to the processing unit 32 on the end portion of the supporting arm 30. The imaging unit 48 is, for example, formed by a visible light camera, an infrared camera, or the like. Incidentally, the supporting arm 30 may be connected to a moving mechanism (not depicted) that moves the supporting arm 30 along the horizontal direction or the vertical direction. In this case, the positions of the processing unit 32 and the imaging unit 48 are controlled by the moving mechanism.

In addition, the laser processing apparatus 2 includes a control section (control unit) 50 that controls the operation of each constituent element constituting the laser processing apparatus 2. Each of the constituent elements (the moving mechanism 8, the chuck table 26, the angle control mechanism 28, the processing unit 32, the moving mechanism 34, the imaging unit 46, the imaging unit 48, and the like) of the laser processing apparatus 2 is connected to the control section 50, so that operation of each of the constituent elements is controlled by the control section 50. The control unit 50 is configured by, for example, a computer.

Figure 3A:
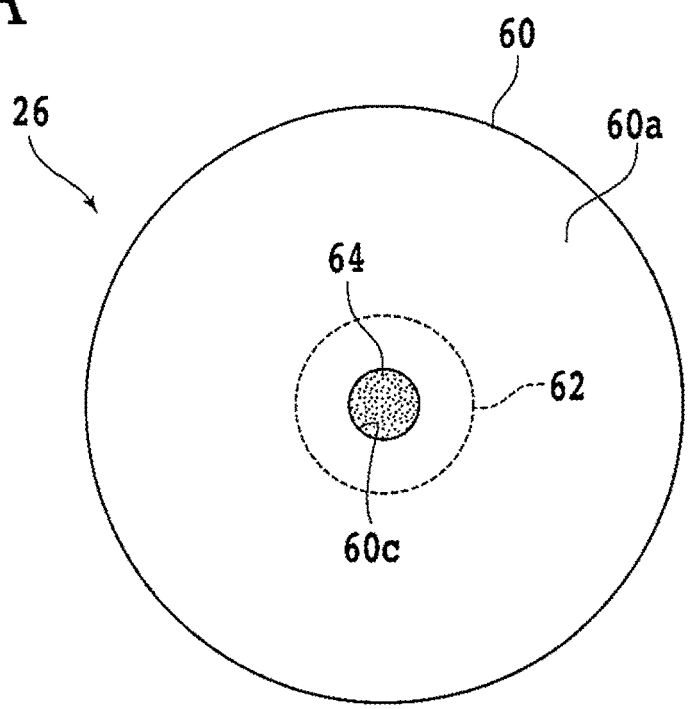
FIG. 3A is a plan view depicting a chuck table.
Figure 3B:
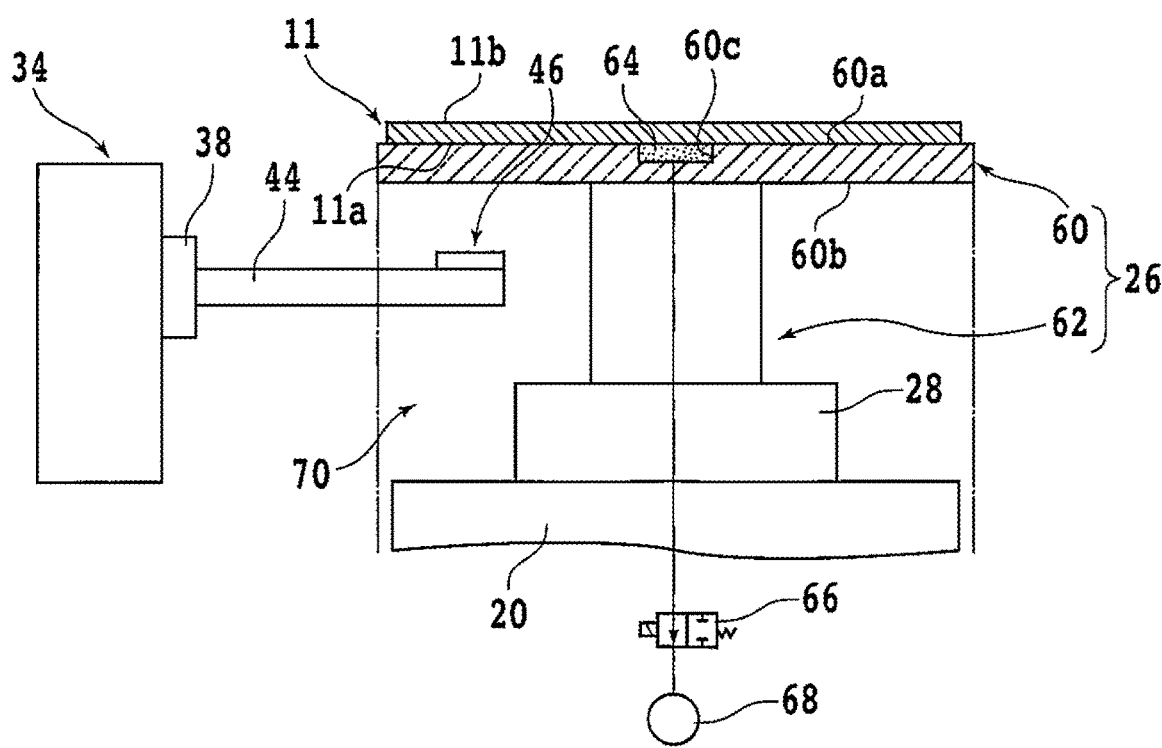
FIG. 3B is a partially sectional side view depicting the chuck table.

The laser processing apparatus 2 images the workpiece 11 by the imaging unit 46 disposed on the lower side of the chuck table 26 and performs positioning between the workpiece 11 and the processing unit 32. In addition, the chuck table 26 is configured such that the imaging unit 46 disposed on the lower side of the chuck table 26 can image the workpiece 11. FIG. 3A is a plan view depicting the chuck table 26. FIG. 3B is a partially sectional side view depicting the chuck table 26. Incidentally, FIG. 3B also depicts the workpiece 11 held by the chuck table 26.

The chuck table 26 includes a disk-shaped holding member 60 that is formed of a transparent body and holds the workpiece 11, and a cylindrical supporting member 62 that supports the holding member 60 from below. The supporting member 62 projects downward from a central portion of the holding member 60. The lower end side of the supporting member 62 is connected to the angle control mechanism 28. Incidentally, the holding member 60 and the supporting member 62 are, for example, concentrically arranged as viewed in plan.

The holding member 60 has an upper surface 60a and a lower surface 60b formed substantially in parallel with each other. The upper surface 60a of the holding member 60 corresponds to the holding surface 26a of the chuck table 26 (see FIG. 1). The upper end side of the supporting member 62 is connected to the lower surface 60b side of the holding member 60. When the supporting member 62 is rotated by the angle control mechanism 28, the holding member 60 rotates about a rotational axis substantially parallel with the Z-axis direction. A recessed portion 60c that is circular as viewed in plan is formed in a central portion on the upper surface 60a side of the holding member 60. A porous member 64 formed of a porous ceramic or the like is fitted into the recessed portion 60c. In addition, the recessed portion 60c is connected to a suction source 68 via a suction passage provided within the holding member 60, the supporting member 62, and the angle control mechanism 28 and a valve 66.

The workpiece 11 is, for example, disposed on the holding member 60 such that the top surface 11a side of the workpiece 11 is opposed to the upper surface 60a of the holding member 60 and such that the undersurface 11b side of the workpiece 11 is exposed upward. Incidentally, when the chuck table 26 holds the top surface 11a side of the workpiece 11 having the devices 15 (see FIG. 2A) formed thereon, a protective member (protecting sheet) formed by a resin or the like may be affixed to the top surface 11a side of the workpiece 11. The top surface 11a side of the workpiece 11 is thereby covered by the protective member, so that the devices 15 are protected. When the valve 66 is opened in a state in which the workpiece 11 is disposed on the holding member 60, a negative pressure acts on the upper surface 60a side of the holding member 60 via the porous member 64, so that the workpiece 11 is held under suction by the chuck table 26. While FIG. 3A and FIG. 3B depict an example in which the holding member 60 is formed in a circular shape as viewed in plan so as to correspond to the shape of the workpiece 11, the shape of the holding member 60 can be changed as appropriate according to the shape of the workpiece 11.

Here, the diameter of the supporting member 62 is smaller than the diameter of the holding member 60. A region 70 superimposed on the holding member 60 but not superimposed on the supporting member 62 is therefore formed below the holding member 60. In the chuck table 26 depicted in FIG. 3B, the region 70 is formed so as to surround the supporting member 62 and is superimposed at least on an outer circumferential portion of the workpiece 11. The imaging unit 46 is disposed in the region 70 by controlling the positions of the chuck table 26 and the angle control mechanism 28 by the moving mechanism 8 (see FIG. 1). The imaging unit 46 then images the workpiece 11 through the holding member 60. As depicted in FIG. 3B, when the top surface 11a side of the workpiece 11 is opposed to the upper surface 60a of the holding member 60, the imaging unit 46 images the top surface 11a side of the workpiece 11. When the imaging unit 46 images the workpiece 11, a distance between the imaging unit 46 and the workpiece 11 is adjusted by moving the imaging unit 46 along the vertical direction by the moving mechanism 34. It is thereby possible to focus the imaging unit 46 and obtain a clear image.

Incidentally, the material of the holding member 60 is selected as appropriate according to the type of the imaging unit 46. In a case where the imaging unit 46 is formed by a visible light camera, for example, the holding member 60 is formed by a member that transmits visible light. In addition, in a case where the imaging unit 46 is formed by an infrared camera, the holding member 60 is formed by a member that transmits infrared rays. Specific examples of the material of the holding member 60 include quartz glass, borosilicate glass, sapphire, calcium fluoride, lithium fluoride, magnesium fluoride, and the like.

By imaging the workpiece 11 by the imaging unit 46 through the holding member 60 from below the holding member 60 as described above, it is possible to image the top surface 11a side of the workpiece 11 covered by the upper surface 60a of the holding member 60. The top surface 11a side of the workpiece 11 can therefore be observed even when a metallic layer or the like is formed on the undersurface 11b side of the workpiece 11 or within the workpiece 11, for example.

Incidentally, the upper surface 60a side of the holding member 60 may be formed in a pear-skin shape having irregular projections and depressions. Alternatively, minute grooves coupled to the recessed portion 60c may be formed on the upper surface 60a side of the holding member 60. In this case, when the workpiece 11 is disposed on the holding member 60, gaps are formed between the workpiece 11 and the upper surface 60a of the holding member 60, and the negative pressure of the suction source 68 acts on the whole of the top surface 11a side of the workpiece 11 via the gaps. The workpiece 11 can thereby be held under suction securely by the chuck table 26.

However, the projections and depressions and the grooves described above are not necessarily required to be formed on the whole of the upper surface 60a side of the holding member 60. That is, the holding member 60 may have a region in which the projections and depressions or the grooves described above are not formed (flat region). This flat region is, for example, provided in a band shape from the center of the holding member 60 to the outer peripheral edge of the holding member 60. More specifically, four band-shaped flat regions are provided at substantially equal intervals along the circumferential direction of the holding member 60 (cross shape as viewed in plan). When the top surface 11a side of the workpiece 11 is imaged by the imaging unit 46, the imaging unit 46 is positioned so as to be superimposed on the flat region of the holding member 60. It is thereby possible to prevent imaging from being obstructed by the projections and depressions or the minute grooves and to obtain a clear image, when the imaging unit 46 images the workpiece 11 through the holding member 60.

Incidentally, the imaging unit 46 cannot be disposed in a region in which the supporting member 62 is disposed, and it is difficult for the imaging unit 46 to image a region of the workpiece 11 which region is superimposed on the supporting member 62. Therefore, in a region of the holding member 60 which region is superimposed on the supporting member 62, the flat regions may not be provided but projections and depressions or grooves may be formed. In this case, the region of the workpiece 11 which region is superimposed on the supporting member 62 is surely sucked. For example, the holding member 60 is provided with a band-shaped flat region along a first direction (for example, the X-axis direction) and a band-shaped flat region along a second direction (for example, the Y-axis direction) intersecting the first direction such that the flat regions intersect each other and are not superimposed on the supporting member 62.

In addition, when the workpiece 11 is imaged by the imaging unit 46, the imaging unit 46 can be positioned in the region 70 by moving the chuck table 26 by the moving mechanism 8 (see FIG. 1). It is therefore possible to perform positioning between the imaging unit 46 and the holding member 60 without separately providing a moving mechanism for moving the imaging unit 46 in the horizontal direction. Thus, the laser processing apparatus 2 can be miniaturized. Further, in the laser processing apparatus 2, as depicted in FIG. 3B, the angle control mechanism 28 is disposed on the lower side of the chuck table 26 so as to be superimposed on the chuck table 26. Therefore, the installation area of the laser processing apparatus 2 is reduced as compared with a case where the rotating mechanism rotating the chuck table 26 is disposed on a side of the chuck table 26, for example.

Figure 4A:
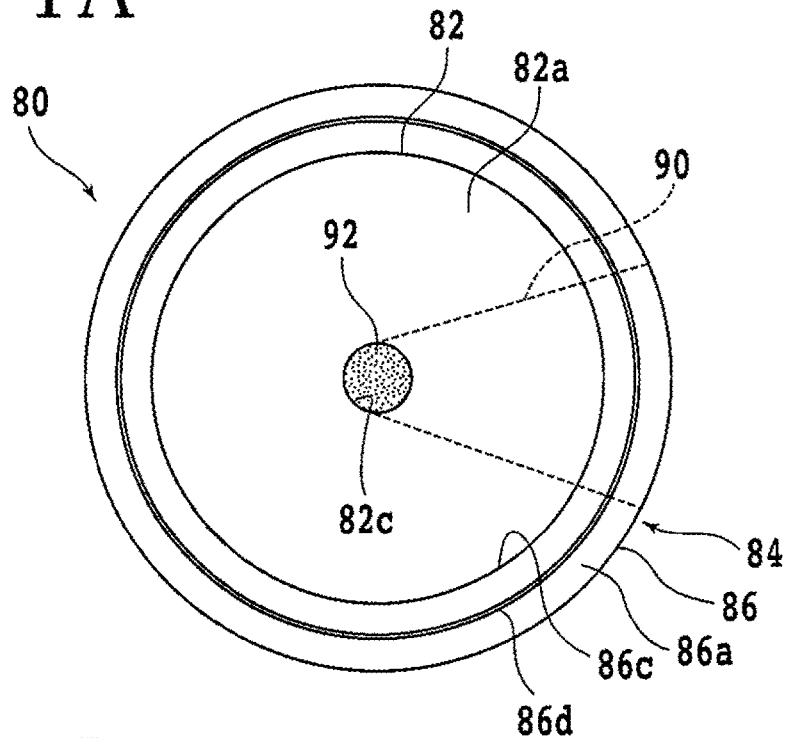
FIG. 4A is a plan view depicting a chuck table.
Figure 4B:
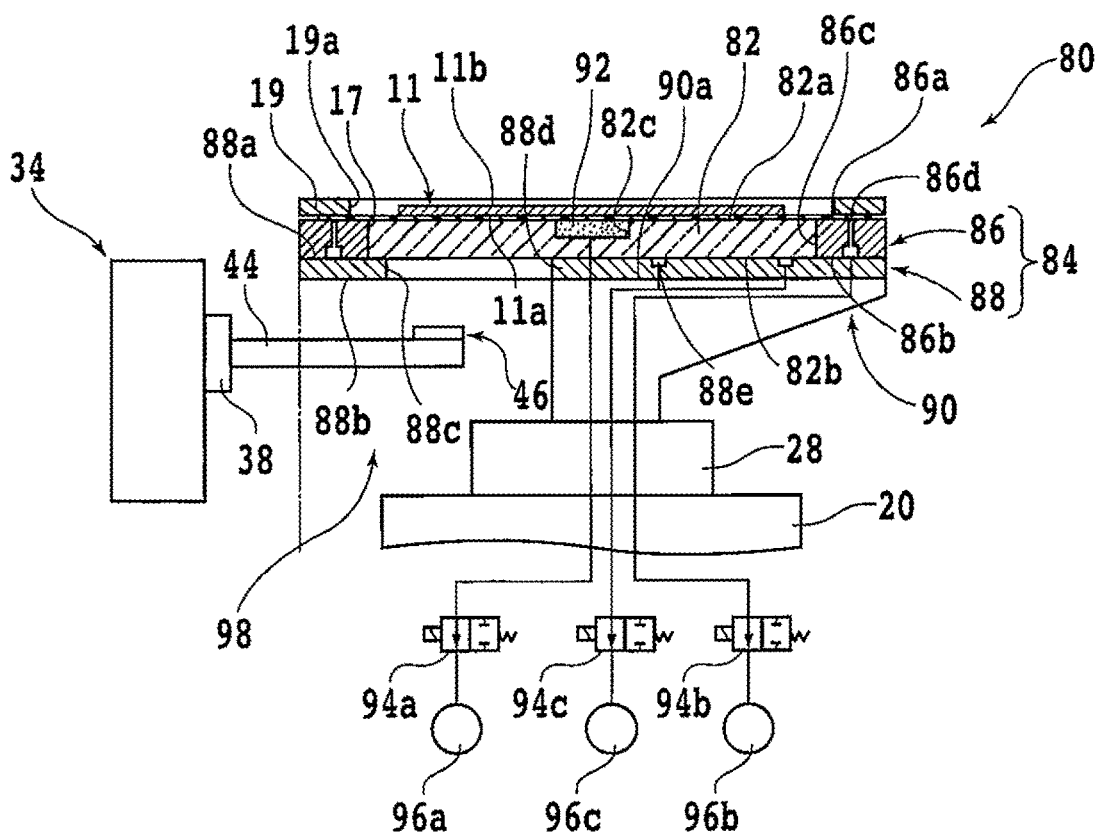
FIG. 4B is a partially sectional side view depicting the chuck table.

Incidentally, the structure of the chuck table 26 can be changed as appropriate insofar as the workpiece 11 can be imaged by the imaging unit 46. FIG. 4A is a plan view depicting a chuck table (holding table) 80. FIG. 4B is a partially sectional side view depicting the chuck table 80. The laser processing apparatus 2 can use the chuck table 80 in place of the chuck table 26 depicted in FIG. 3A and FIG. 3B. The chuck table 80 includes a disk-shaped holding member 82 that is formed by a transparent body and holds the workpiece 11, an outer circumference holding member 84 that holds at least an outer circumferential portion of the holding member 82, and a supporting member 90 that supports the outer circumference holding member 84 from a lower side.

The holding member 82 includes an upper surface 82a, a lower surface 82b, and a recessed portion 82c formed in a central portion on the upper surface 82a side. A porous member 92 is fitted into the recessed portion 82c. Incidentally, the shape, material, and the like of the holding member 82 are similar to those of the holding member 60 of the chuck table 26 (see FIG. 3A and FIG. 3B). The recessed portion 82c of the holding member 82 is connected to a suction source 96a via a suction passage formed within the outer circumference holding member 84, the supporting member 90, and the angle control mechanism 28 and a valve 94a.

The outer circumference holding member 84 includes an annular upper member 86 and an annular lower member 88 formed with substantially the same diameter as the upper member 86 and disposed on the lower side of the upper member 86. Incidentally, the upper member 86 and the lower member 88 may be formed integrally with each other or may be formed separately from each other. The upper member 86 has an opening 86c that penetrates the upper member 86 from an upper surface 86a to a lower surface 86b. The opening 86c is formed in such a size as to be able to house the holding member 82 therewithin and is, for example, formed in a circular shape having substantially the same diameter as the holding member 82. In addition, the thickness of the upper member 86 is set to be substantially the same as the thickness of the holding member 82. The lower member 88 has an opening 88c that penetrates the lower member 88 from an upper surface 88a to a lower surface 88b. The diameter of the opening 88c is set smaller than the diameter of the holding member 82 and the diameter of the opening 86c of the upper member 86. In addition, the lower member 88 has a plate-shaped supporting portion 88d reaching a central portion of the lower member 88 from an outer circumferential portion of the lower member 88. The supporting portion 88d is, for example, formed in a sectorial shape as viewed in plan so as to be decreased in width from the outer circumferential portion to the central portion of the lower member 88.

The supporting member 90 is connected to the lower surface 88b side of the lower member 88. The supporting member 90 supports at least a part of the outer circumferential portion of the outer circumference holding member 84 (lower member 88). For example, an upper surface 90a of the supporting member 90 is formed in a sectorial shape so as to correspond to the lower surface of the supporting portion 88d of the lower member 88, and the supporting member 90 supports a sectorial region extending from the center to the outer circumferential portion of the outer circumference holding member 84 (lower member 88). The lower end side of the supporting member 90 is connected to the angle control mechanism 28. In addition, the supporting member 90 is formed in a shape decreased in width (diameter) downward from the upper surface 90a side. Further, the supporting member 90 is formed in a shape increased in thickness (length in a height direction) toward a central portion thereof from an outer circumferential portion thereof.

In addition, an annular suction hole 86d that vertically penetrates the upper member 86 is formed in an outer circumferential portion of the upper member 86 (a region in which the opening 86c is not formed). The suction hole 86d is connected to a suction source 96b via a suction passage formed within the lower member 88, the supporting member 90, and the angle control mechanism 28 and a valve 94b. In addition, a plurality of recessed portions 88e are formed on the upper surface 88a side of the supporting portion 88d of the lower member 88. The recessed portions 88e are connected to a suction source 96c via a suction passage formed in the lower member 88, the supporting member 90, and the angle control mechanism 28 and a valve 94c.

When the valve 94c is opened in a state in which the holding member 82 is fitted in the opening 86c of the upper member 86, the negative pressure of the suction source 96c acts on the lower surface 82b side of the holding member 82. The holding member 82 is thereby held under suction by the outer circumference holding member 84, in a state in which at least the outer circumferential portion of the holding member 82 is supported by the upper surface 88a of the lower member 88. In addition, when the supporting member 90 is rotated by the angle control mechanism 28, the holding member 82 and the outer circumference holding member 84 rotate about a rotational axis substantially parallel with the Z-axis direction. Incidentally, when the outer circumference holding member 84 holds the holding member 82, the supporting portion 88d is superimposed on a part of the holding member 82 and supports the holding member 82. In addition, a part of the lower surface 82b side of the holding member 82 is exposed downward through the opening 88c of the lower member 88.

The chuck table 80 holds the workpiece 11 supported by the frame 19 (see FIG. 2B). The workpiece 11 is, for example, disposed on the holding member 82 such that the top surface 11a side (tape 17 side) is opposed to the upper surface 82a of the holding member 82 and such that the undersurface 11b side is exposed upward. At this time, the workpiece 11 is superimposed on the recessed portion 82c of the holding member 82 with the tape 17 interposed therebetween, and the frame 19 is superimposed on the suction hole 86d of the upper member 86 with the tape 17 interposed therebetween. When the valve 94a and the valve 94b are opened in this state, the negative pressures of the suction source 96a and the suction source 96b act on the tape 17. The chuck table 80 thereby holds under suction the workpiece 11 and the frame 19 via the tape 17.

Incidentally, a region 98 superimposed on the holding member 82 but not superimposed on the supporting member 90 is formed below the holding member 82. In addition, the imaging unit 46 is disposed in the region 98 by controlling the positions of the chuck table 80 and the angle control mechanism 28 by the moving mechanism 8 (see FIG. 1). The imaging unit 46 then images the workpiece 11 through the opening 88c of the lower member 88 and the holding member 82. The imaging unit 46, for example, images the top surface 11a side of the outer circumferential portion of the workpiece 11. Then, the control section 50 (see FIG. 1) performs positioning (alignment) between the workpiece 11 held by the chuck table 26 or the chuck table 80 and the processing unit 32, on the basis of an image obtained by the imaging unit 46.

Incidentally, as depicted in FIG. 1, the laser processing apparatus 2 includes the imaging unit 48 in addition to the imaging unit 46. The positioning between the workpiece 11 and the processing unit 32 can also be performed by using both the imaging unit 46 and the imaging unit 48. In a case where the alignment is performed by using the imaging unit 46 and the imaging unit 48, the positioning between the imaging unit 46 and the imaging unit 48 is first performed. The positioning between the imaging unit 46 and the imaging unit 48 is performed by making a position in the horizontal direction (XY plane direction) of a region to be imaged by the imaging unit 46 coincide with a position in the horizontal direction of a region to be imaged by the imaging unit 48. A positioning member provided with a target (alignment mark) for the positioning, for example, can be used for the positioning between the imaging unit 46 and the imaging unit 48.

Figure 5:
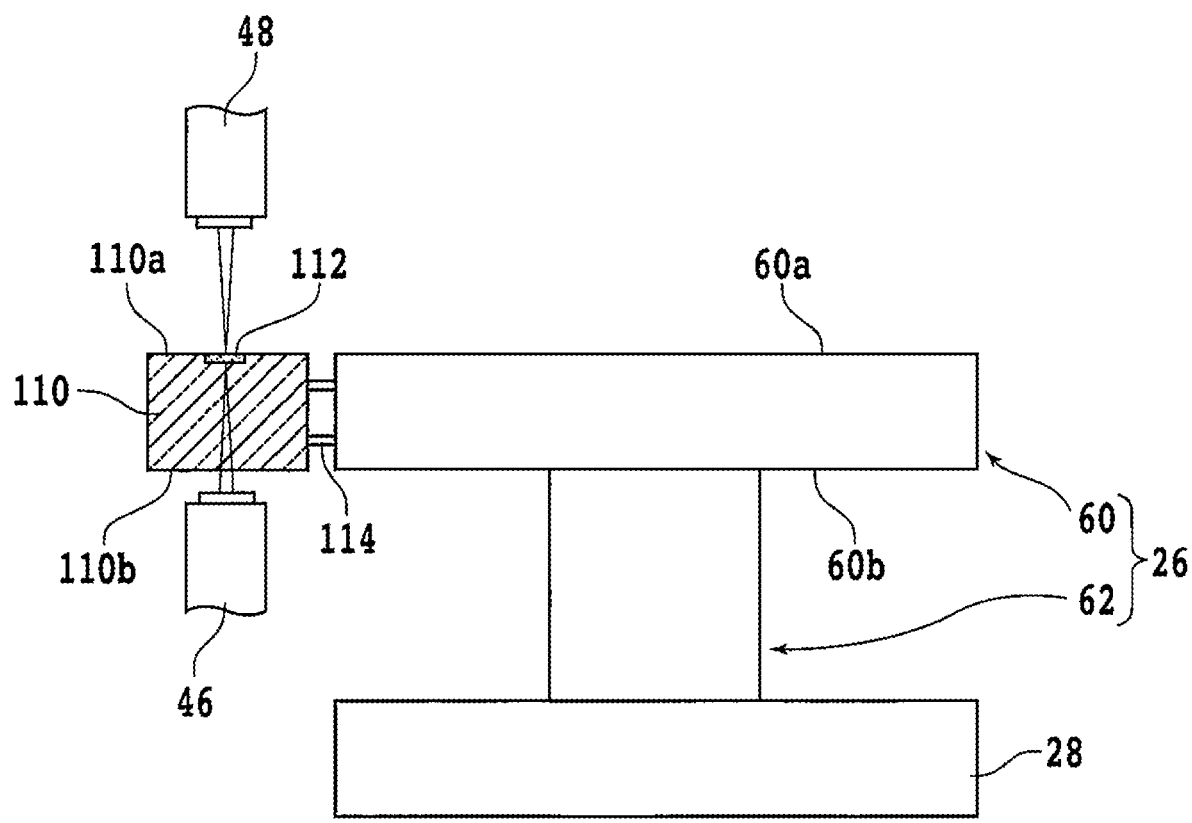
FIG. 5 is a partially sectional side view depicting a chuck table fitted with a positioning member.

FIG. 5 is a partially sectional side view depicting the chuck table 26 to which a positioning member 110 is fitted. The positioning member 110 is connected to the chuck table 26 depicted in FIG. 5 via a connecting member 114. The positioning member 110 is, for example, formed by a transparent body in a rectangular parallelepipedic shape. The positioning member 110 is fixed to a side of the holding member 60. The material of the positioning member 110 is, for example, similar to that of the holding member 60. A target (alignment mark) 112 serving as a mark for the positioning between the imaging unit 46 and the imaging unit 48 is set on an upper surface 110a side of the positioning member 110. The target 112 can be imaged by the imaging unit 46 and the imaging unit 48. The target 112, for example, corresponds to a colored region on the upper surface 110a side of the positioning member 110.

Incidentally, a method of setting the target 112 is not limited as long as the imaging unit 46 and the imaging unit 48 can image the target 112. For example, the target 112 may be a member constituted of a metal or the like formed on the upper surface 110a side of the positioning member 110 or may be a through hole that penetrates the positioning member 110 from the upper surface 110a to a lower surface 110b of the positioning member 110. In addition, targets 112 may be set on the upper surface 110a side and the lower surface 110b side of the positioning member 110 so as to be superimposed on each other.

The target 112 is imaged from a lower side by the imaging unit 46 and is imaged from an upper side by the imaging unit 48. Then, the positioning between the imaging unit 46 and the imaging unit 48 is performed such that the position of the target 112 displayed in an image obtained by the imaging unit 46 coincides with the position of the target 112 displayed in an image obtained by the imaging unit 48. This positioning is performed by the control section 50 (see FIG. 1) of the laser processing apparatus 2, for example. The positioning between the imaging unit 46 and the imaging unit 48 may be performed by adjusting the position of the imaging unit 48 by the moving mechanism (not depicted) connected to the imaging unit 48 or may be performed by controlling optical systems of the imaging unit 46 and the imaging unit 48. In addition, this positioning may be performed on software. In this case, for example, the coordinates of the image obtained by the imaging unit 46 and the coordinates of the image obtained by the imaging unit 48 are corrected according to an amount of displacement of the position of the target 112.

Description will next be made of a specific example of a method of processing the workpiece 11 by using the laser processing apparatus 2. The following description will be made of processing of cutting and dividing the workpiece 11 by the application of a laser beam.

Figure 6A:
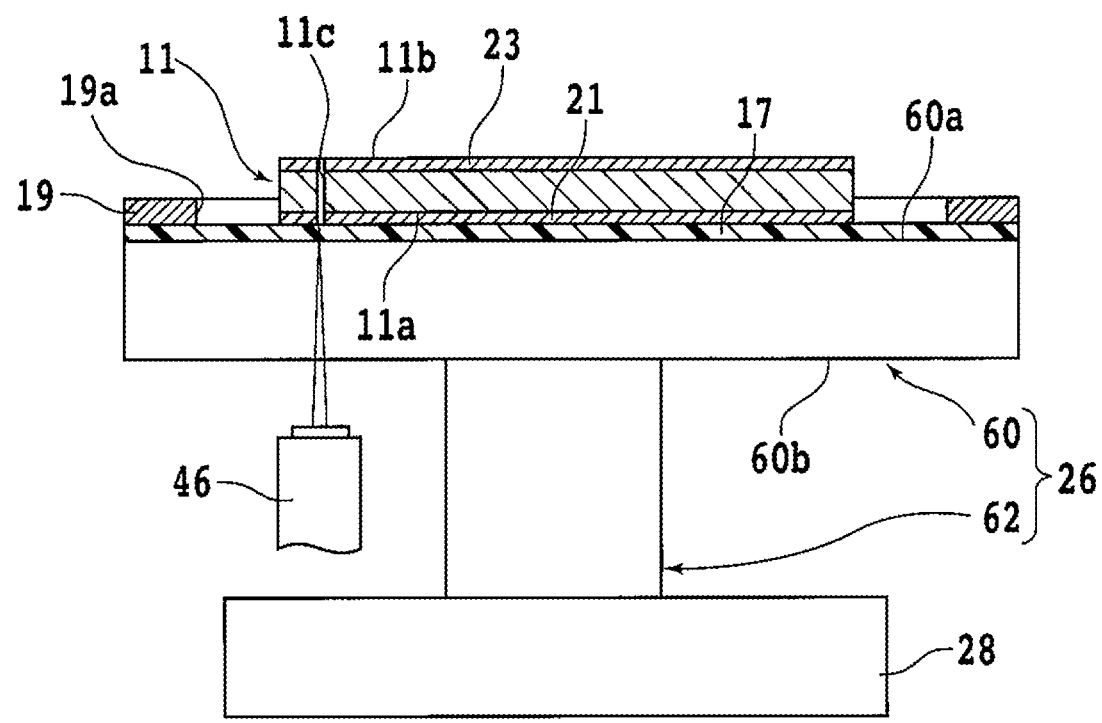
FIG. 6A is a partially sectional side view depicting the workpiece held by the chuck table.

First, the tape 17 (see FIG. 2B) is affixed to the top surface 11a side of the workpiece 11 (tape affixing step). Next, the chuck table 26 holds the workpiece 11 via the tape 17 (holding step). FIG. 6A is a partially sectional side view depicting the workpiece 11 held by the chuck table 26. In the holding step, the workpiece 11 is disposed on the chuck table 26 such that the top surface 11a side is opposed to the upper surface 60a of the holding member 60 and such that the undersurface 11b side is exposed upward. Incidentally, a pattern layer (functional layer) 21 including various kinds of functional films (a conductive film, an insulating film, and the like) constituting a plurality of devices 15 (see FIG. 2B) is formed on the top surface 11a side of the workpiece 11. In addition, FIG. 6A depicts the workpiece 11 having a metallic layer 23 formed on the undersurface 11b side.

Next, a region to be processed in the workpiece 11 is identified by imaging the top surface 11a side of the workpiece 11 through the holding member 60 by the imaging unit 46 located in a region that is on the lower side of the holding member 60 and that is not superimposed on the supporting member 62 (identifying step). In the identifying step, first, the imaging unit 46 is positioned below the supporting member 62 by the moving mechanism 34 (see FIG. 1 and the like). Then, the imaging unit 46 is disposed in a position superimposed on the holding member 60 but not superimposed on the supporting member 62 by moving the chuck table 26 and the angle control mechanism 28 in the horizontal direction by the moving mechanism 8 (see FIG. 1). Next, the imaging unit 46 images the top surface 11a side of the workpiece 11 through the holding member 60. An enlarged image of planned dividing lines 13 and devices 15 (see FIG. 2B), for example, is thereby obtained. The region to be processed by the processing unit 32 (see FIG. 1) in the workpiece 11 is identified on the basis of the image. This region is, for example, set along the center of the planned dividing line 13.

Next, the processing unit 32 cuts the workpiece 11 along the region to be processed (processing target region) (processing step). In the processing step, first, the length direction of the planned dividing line 13 of the workpiece 11 is aligned with the X-axis direction. In addition, positional relation between the processing unit 32 and the chuck table 26 is adjusted so that the laser beam is applied to the processing target region of the workpiece 11. Then, the chuck table 26 is moved in the X-axis direction while the laser beam is applied from the processing unit 32 to the undersurface 11b side of the workpiece 11. The laser beam is thereby applied along the planned dividing line 13. Incidentally, laser beam application conditions (position of a condensing point, power, a spot diameter, a repetition frequency, the number of times of application, and the like) are set such that the workpiece 11 is cut along the planned dividing line 13. As a result, a processing trace (cut groove) 11c reaching the top surface 11a from the undersurface 11b of the workpiece 11 is formed in the workpiece 11.

Figure 6B:
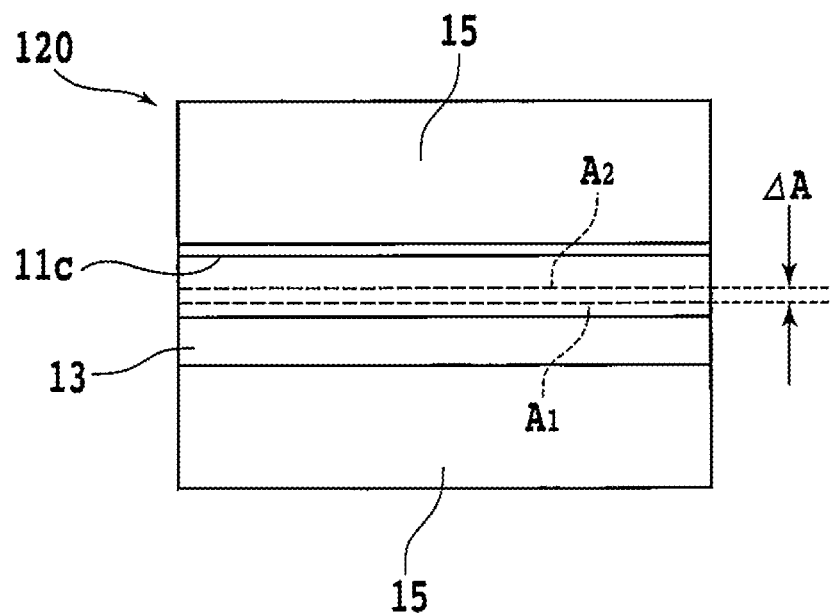
FIG. 6B is an image diagram depicting an image obtained by an imaging unit.

Next, the imaging unit 46 located in a region that is on the lower side of the holding member 60 and is not superimposed on the supporting member 62 images the top surface 11a side of the workpiece 11 through the holding member 60, and a difference between the position of the region to be processed and the position of the processing trace 11c is detected (detecting step). In the detecting step, first, the imaging unit 46 is disposed in a position superimposed on the holding member 60 but not superimposed on the supporting member 62 by a procedure similar to the above-described identifying step. Then, the imaging unit 46 images the top surface 11a side of the workpiece 11. FIG. 6B is an image diagram depicting an image 120 obtained by the imaging unit 46. The image 120 depicts devices 15 formed on the top surface 11a side of the workpiece 11 and a linear processing trace 11c formed by the processing unit 32 (see FIG. 1).

Next, the position $A_1$ of the region to be processed and the position $A_2$ of the processing trace 11c are detected. For example, a central position in the width direction of the planned dividing line 13, that is, a position at equal distances from the two devices 15 adjacent to each other, is detected as the position $A_1$. In addition, for example, a central position in the width direction of the processing trace 11c is detected as the position $A_2$. Then, a difference $\Delta A$ between the position $A_1$ of the region to be processed and the position $A_2$ of the processing trace 11c is detected by the control section 50 (see FIG. 1). This $\Delta A$ is stored in a storage unit included in the control section 50, as correction information for correcting, in a subsequent correcting step, the position of the region to be processed. By this detecting step, an amount of displacement between the position of the region to be processed and the position of an actually processed region is identified.

Next, the position of the workpiece 11 to be processed by the processing unit 32 is corrected on the basis of the difference $\Delta A$ between the position $A_1$ of the region to be processed and the position $A_2$ of the processing trace 11c (position correcting step). This position correcting step is, for example, performed after a predetermined number of processing traces 11c are formed or before processing of another workpiece 11 is started after processing of one workpiece 11 is completed. In the position correcting step, $\Delta A$ obtained as the correction information in the detecting step is referred to, and the positions of the chuck table 26 and the processing unit 32 are shifted by $\Delta A$. A difference between the position of the region to be processed and the position of the actually processed region is thereby reduced. When the processing trace 11c is then formed along all of the planned dividing lines 13, the workpiece 11 is divided into a plurality of device chips each having a device 15.

Incidentally, the above description has been made of a case where a processing position is corrected on the basis of the position of the processing trace 11c produced by cutting the workpiece 11. However, the processing position can also be corrected on the basis of the position of a processed groove 11d (see FIG. 7A) formed on the undersurface 11b side of the workpiece 11 to a depth not reaching the top surface 11a. The following description will be made of a method of correcting the processing position on the basis of the processed groove 11d.

Figure 7A:
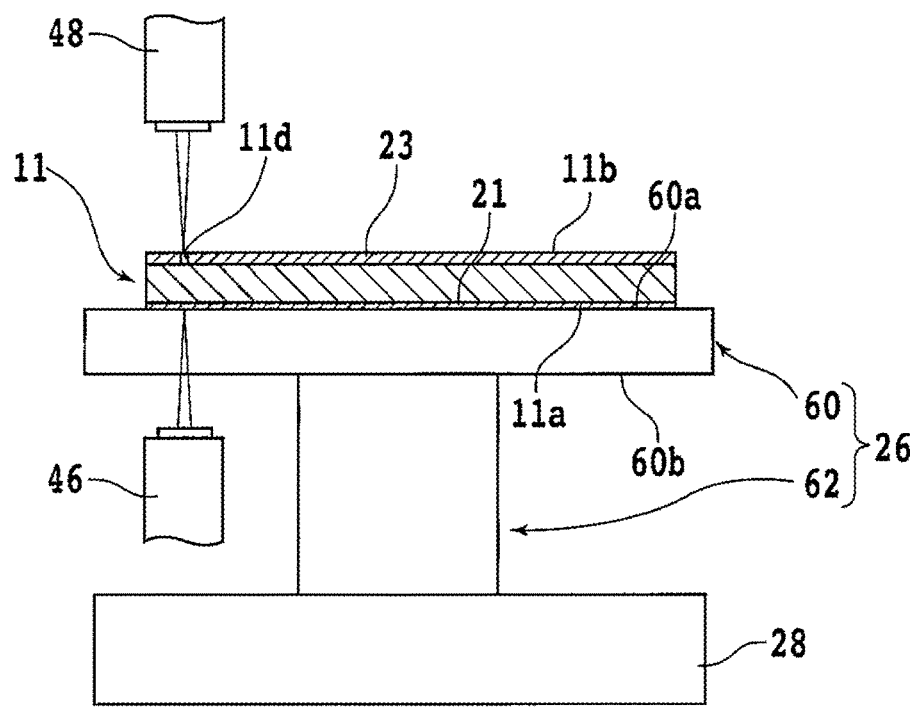
FIG. 7A is a partially sectional side view depicting the workpiece held by the chuck table.

First, the chuck table 26 holds the workpiece 11 (holding step). FIG. 7A is a partially sectional side view depicting the workpiece 11 held by the chuck table 26. In the holding step, the workpiece 11 is disposed on the chuck table 26 such that the top surface 11a side is opposed to the upper surface 60a of the holding member 60 and such that the undersurface 11b side is exposed upward. The above-described identifying step is thereafter performed to identify the region to be processed in the workpiece 11.

Next, the processing unit 32 (see FIG. 1) forms the processed groove 11d in the workpiece 11 along the region to be processed (processing step). In the processing step, first, the length direction of the planned dividing line 13 of the workpiece 11 is aligned with the X-axis direction. In addition, positional relation between the processing unit 32 and the chuck table 26 is adjusted so that the laser beam is applied to the region to be processed. Thereafter, the chuck table 26 is moved in the X-axis direction while the laser beam is applied from the processing unit 32 to the undersurface 11b side of the workpiece 11. The laser beam is thereby applied along the planned dividing line 13. Incidentally, laser beam application conditions are set such that the processed groove 11d having a depth smaller than the thickness of the workpiece 11 is formed on the undersurface 11b side of the workpiece 11.

Figure 7B:
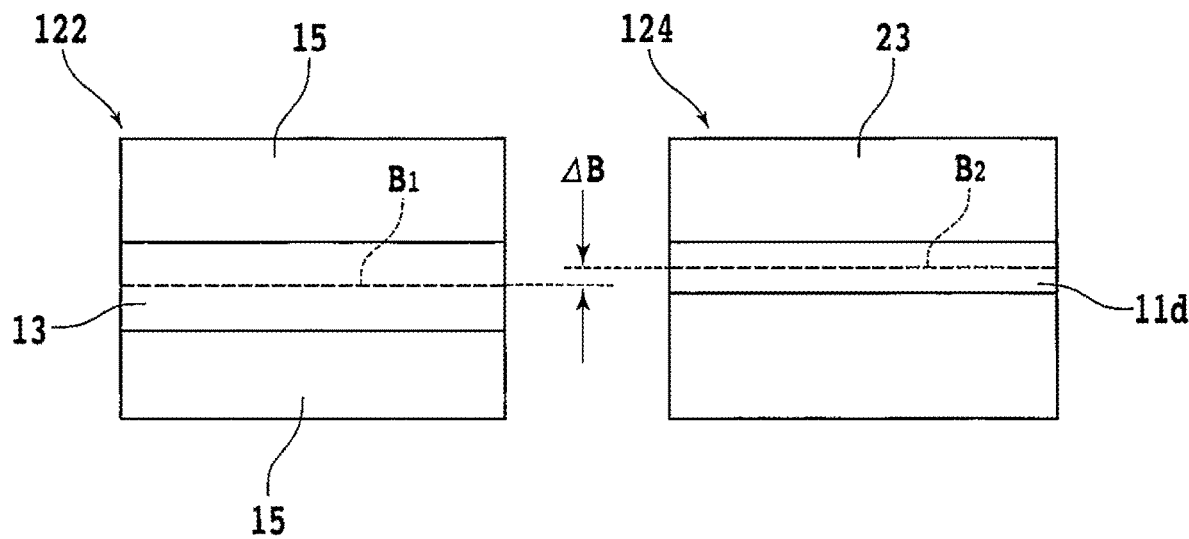
FIG. 7B is an image diagram depicting images obtained by imaging units.

Next, the imaging unit 48 positioned on the upper side of the holding member 60 images the processed groove 11d, and a difference between the position of the region to be processed and the position of the processed groove 11d is detected (detecting step). In the detecting step, the imaging unit 48 images the processed groove 11d from the undersurface 11b side of the workpiece 11. FIG. 7B is an image diagram depicting an image 122 obtained by the imaging unit 46 and an image 124 obtained by the imaging unit 48. Incidentally, the image 122 is an image obtained by imaging the top surface 11a side of the workpiece 11 by the imaging unit 46 in the above-described identifying step. However, the top surface 11a side of the workpiece 11 may be imaged by the imaging unit 46 again in the detecting step. The image 122 indicates devices 15 formed on the top surface 11a side of the workpiece 11. In addition, the image 124 indicates the processed groove 11d formed on the undersurface 11b side (metallic layer 23 side) of the workpiece 11.

Next, the position $B_1$ of the region to be processed and the position $B_2$ of the processed groove 11d are detected. For example, a central position in the width direction of the planned dividing line 13, that is, a position at equal distances from the two devices 15 adjacent to each other, is detected as the position $B_1$ on the basis of the image 122. In addition, for example, a central position in the width direction of the processed groove 11d is detected as the position $B_2$ on the basis of the image 124. Then, the control section 50 (see FIG. 1) detects a difference $\Delta B$ between the position $B_1$ of the region to be processed and the position $B_2$ of the processed groove 11d. This $\Delta B$ is stored in a storage unit included in the control section 50, as correction information for correcting, in a subsequent correcting step, the position of the region to be processed.

Next, the position of the workpiece 11 to be processed by the processing unit 32 is corrected on the basis of the difference ΔB between the position B₁ of the region to be processed and the position B₂ of the processed groove 11d (position correcting step). In the position correcting step, ΔB obtained as the correction information in the detecting step is referred to, and the positions of the chuck table 26 and the processing unit 32 are shifted by ΔB. A difference between the position of the region to be processed and the actually processed position can thereby be reduced.

Incidentally, positioning between the workpiece 11 and the processing unit 32 before the performance of the processing of the workpiece 11 can also be performed by using the imaging unit 46 and the imaging unit 48. The following description will be made of a specific example of the positioning between the workpiece 11 and the processing unit 32.

Figure 8A:
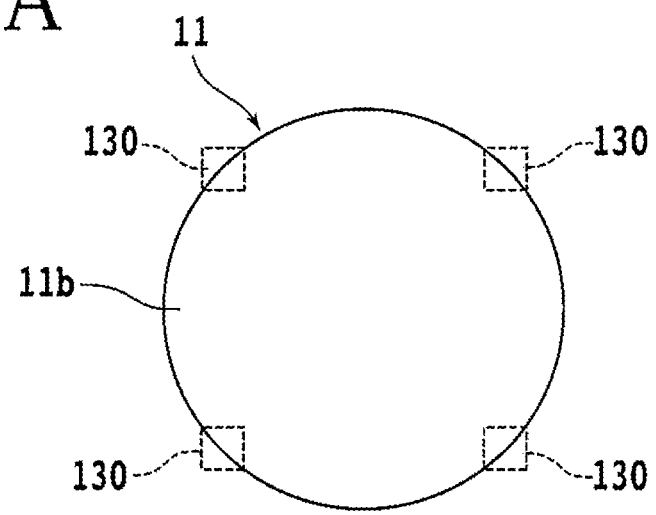
FIG. 8A is a plan view depicting an undersurface side of the workpiece imaged by the imaging unit.

First, the imaging unit 48 provided on the upper side of the holding member 60 images the undersurface 11b side (upper surface side) of the workpiece 11 held by the chuck table 26. FIG. 8A is a plan view depicting the undersurface 11b side of the workpiece 11 imaged by the imaging unit 48. The imaging unit 48, for example, images a plurality of outer circumferential regions 130 (four outer circumferential regions in FIG. 8A) of the workpiece 11.

When the imaging unit 48 obtains images of the outer circumferential regions 130 of the workpiece 11, the control section 50 (see FIG. 1) detects the coordinates of an outer peripheral edge (edge portion) of the workpiece 11 at three or more positions (for example, four positions). The outer peripheral edge of the workpiece 11 is detected by, for example, subjecting the images obtained by the imaging unit 48 to predetermined image processing (edge detection or the like). Thereafter, the control section 50 detects the center coordinates, diameter, and the like of the workpiece 11 on the basis of the coordinates of the outer peripheral edge of the workpiece 11. The shape of the workpiece 11 is thereby identified. In addition, whether or not the workpiece 11 is disposed in a desired position on the chuck table 26 is checked on the basis of the center coordinates of the workpiece 11 and the coordinates of the outer peripheral edge.

Figure 8B:
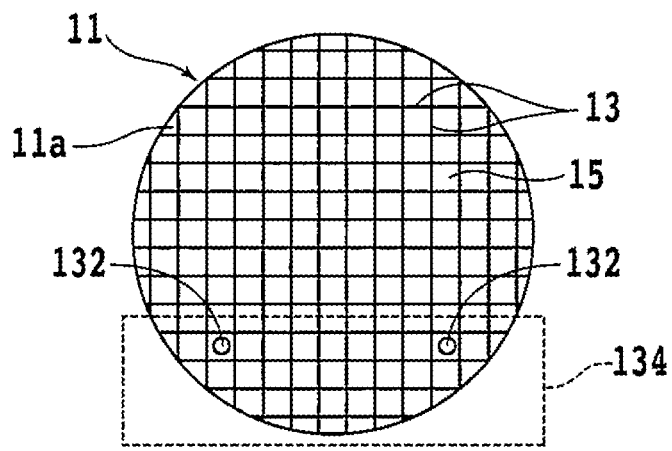
FIG. 8B is a bottom view depicting a top surface side of the workpiece imaged by the imaging unit.

Meanwhile, the imaging unit 46 provided on the lower side of the holding member 60 images the top surface 11a side (lower surface side) of the workpiece 11 held by the chuck table 26. FIG. 8B is a bottom view depicting the top surface 11a side of the workpiece 11 imaged by the imaging unit 46. Incidentally, targets (alignment marks) 132 serving as marks at a time of positioning between the workpiece 11 and the processing unit 32 (see FIG. 1) are set on the top surface 11a side of the workpiece 11. FIG. 8B depicts, for instance, an example in which a pair of targets 132 is set.

For example, the imaging unit 46 images an outer circumferential region 134 on the top surface 11a side of the workpiece 11 from the lower side of the holding member 60. An image obtained by the imaging unit 46 indicates devices 15 and the targets 132 formed on the top surface 11a side of the workpiece 11. Then, on the basis of the positions of the devices 15 and the targets 132 indicated in the image, the control section 50 (see FIG. 1) adjusts the position and angle of the chuck table 26 and thereby performs positioning between the workpiece 11 and the processing unit 32. For example, the angle of the chuck table 26 is adjusted such that the pair of targets 132 set on the workpiece 11 is disposed on one straight line parallel with the X-axis direction (see FIG. 1). In addition, the position of the chuck table 26 is adjusted such that the position of a planned dividing line 13 of the workpiece 11 coincides with the application position of the laser beam. The angle of the chuck table 26 is controlled by the angle control mechanism 28 (see FIG. 1 and the like), and the position of the chuck table 26 is controlled by the moving mechanism 8 (see FIG. 1). Incidentally, the dimensions of the device 15, the width of the planned dividing lines 13, and the like may be measured on the basis of the image obtained by the imaging unit 46. In this case, intervals of laser application regions or the like can be set on the basis of the actual dimensions of the devices 15 and the actual width of the planned dividing lines 13.

Figure 8C:
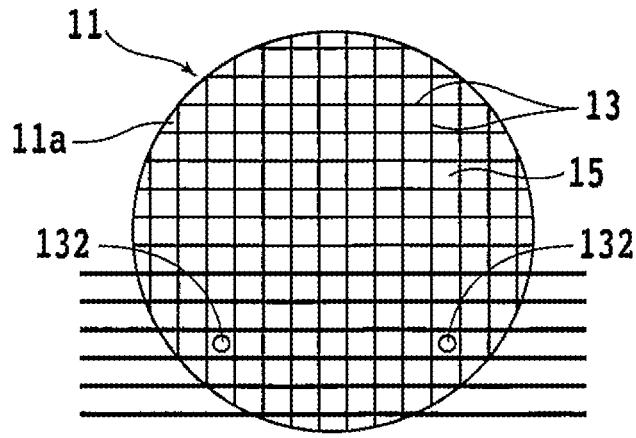
FIG. 8C is a bottom view depicting the top surface side of the workpiece processed along planned dividing lines.

The workpiece 11 is thereafter subjected to predetermined processing by application of the laser beam from the processing unit 32 to the undersurface 11b side of the workpiece 11. FIG. 8C is a bottom view depicting the top surface 11a side of the workpiece 11 processed along planned dividing lines 13. The workpiece 11 is, for example, divided along the planned dividing lines 13 by the application of the laser beam.

Figure 9A:
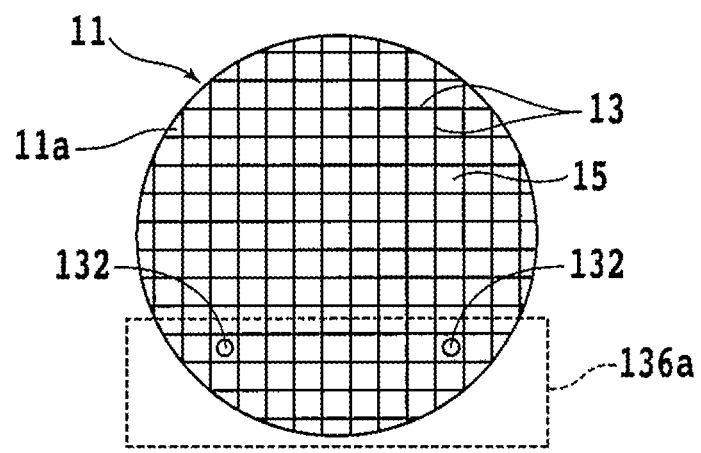
FIG. 9A is a bottom view depicting the top surface side of the workpiece with a first outer circumferential region imaged by the imaging unit.
Figure 9B:
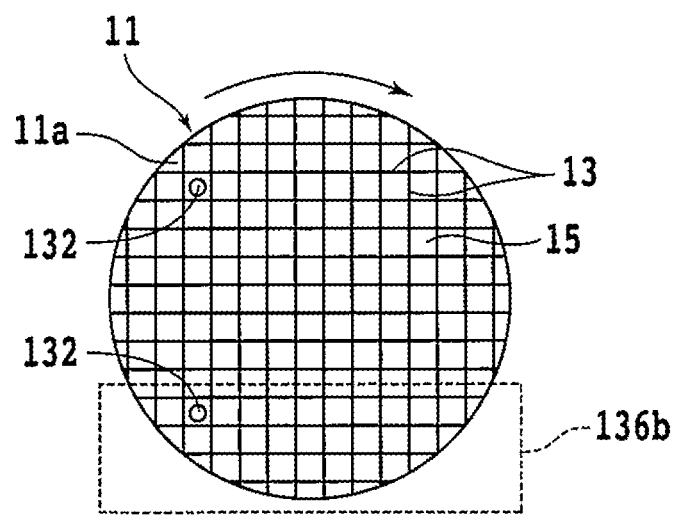
FIG. 9B is a bottom view depicting the top surface side of the workpiece with a second outer circumferential region imaged by the imaging unit.

Incidentally, when the positioning between the workpiece 11 and the processing unit 32 is performed, the imaging unit 46 may image a plurality of regions of the workpiece 11. FIG. 9A is a bottom view depicting the top surface 11a side of the workpiece 11 with a first outer circumferential region 136a imaged by the imaging unit 46. FIG. 9B is a bottom view depicting the top surface 11a side of the workpiece 11 with a second outer circumferential region 136b imaged by the imaging unit 46.

The imaging unit 46 first images the first outer circumferential region 136a of the workpiece 11. The angle of the workpiece 11 is then adjusted on the basis of an image of the first outer circumferential region 136a which image is obtained by the imaging unit 46 (see FIG. 9A). Here, in a case where the positioning between the workpiece 11 and the processing unit 32 is performed on the basis of an image of a region other than the first outer circumferential region 136a of the workpiece 11, the angle control mechanism 28 (see FIG. 1 and the like) rotates the chuck table 26 in the first direction (for example, clockwise) by 90° (see FIG. 9B), and the imaging unit 46 images the second outer circumferential region 136b of the workpiece 11. An image of the second outer circumferential region 136b of the workpiece 11 is thereby obtained. Then, on the basis of the image of the second outer circumferential region 136b, the position of the chuck table 26 is adjusted, and the positioning between the workpiece 11 and the processing unit 32 is thereby performed. After the positioning between the workpiece 11 and the processing unit 32 is completed, the chuck table 26 is rotated by 90° in a second direction (for example, counterclockwise) opposite from the first direction to return the angle of the workpiece 11 to the state depicted in FIG. 9A. The workpiece 11 is thereafter processed along the planned dividing lines 13 by being irradiated with the laser beam (see FIG. 8C).

In addition, even in a case where the processing trace 11c (see FIG. 6A) or the processed groove 11d (see FIG. 7A) as a detection target is not formed in a range that can be imaged by the imaging unit 46 or the imaging unit 48 in the above-described detecting step, a desired region of the workpiece 11 can be disposed on the upper side of the imaging unit 46 by rotating the chuck table 26 as described above. The position of the processing trace 11c or the processed groove 11d can thereby be detected in any position of the workpiece 11.

As described above, the laser processing apparatus 2 according to the present embodiment can image the workpiece 11 through the holding member 60 by the imaging unit 46 in a state in which the imaging unit 46 is positioned in a region that is on the lower side of the holding member 60 and is not superimposed on the supporting member 62 by moving the chuck table 26 by the moving mechanism 8. It is thus possible to perform positioning between the imaging unit 46 and the holding member 60 without separately providing a moving mechanism for moving the imaging unit 46 in the horizontal direction. The laser processing apparatus 2 can therefore be miniaturized. In addition, in the laser processing apparatus 2, the angle control mechanism 28 is disposed on the lower side of the chuck table 26. Therefore, the installation area of the laser processing apparatus 2 is reduced as compared with a structure in which the angle control mechanism 28 is disposed on a side of the chuck table 26, for example.

Incidentally, while FIG. 1 depicts an example in which one set of the imaging unit 46 is provided in the rear of the moving mechanism 8, the laser processing apparatus 2 may be provided with two or more sets of the imaging unit 46. For example, a moving mechanism 34, a supporting arm 44 disposed along the X-axis direction from the moving mechanism 34, and an imaging unit 46 fixed to the supporting arm 44 may be provided on a side of the moving mechanism 8. A a result, two regions of the workpiece 11 (for example, the first outer circumferential region 136a depicted in FIG. 9A and the second outer circumferential region 136b depicted in FIG. 9B) can be imaged without the chuck table 26 being rotated.

In addition, while the above description has been made of the laser processing apparatus 2 that processes the workpiece 11 by the application of the laser beam, the type of the processing apparatus according to the present invention is not limited. For example, the processing apparatus according to the present invention may be a cutting apparatus that cuts the workpiece 11. The cutting apparatus includes a chuck table that holds the workpiece 11, and a processing unit (cutting unit) fitted with an annular cutting blade that cuts the workpiece 11 held by the chuck table. The chuck table 26 depicted in FIG. 3A and FIG. 3B or the chuck table 80 depicted in FIG. 4A and FIG. 4B can be used as the chuck table of the cutting apparatus.

In addition, structures, methods, and the like according to the foregoing embodiment can be modified and carried out as appropriate without departing from the objective scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A workpiece processing method for processing a workpiece by using a processing apparatus,
the processing apparatus including:
a chuck table configured to hold the workpiece by a holding surface,
a processing unit configured to process the workpiece held by the chuck table,
a moving mechanism configured to move the chuck table relative to the processing unit along a direction parallel with the holding surface of the chuck table,
an angle control mechanism disposed on the moving mechanism and on a lower side of the chuck table, the angle control mechanism controlling an angle of the chuck table, and
a first imaging unit and a second imaging unit configured to image the workpiece held by the chuck table,
the chuck table including a holding member formed by a transparent body and holding the workpiece and a supporting member supporting a part of the holding member and connected to the angle control mechanism, the workpiece processing method comprising:
a holding step of holding the workpiece by the chuck table such that a top surface side of the workpiece is opposed to an upper surface of the holding member;
an identifying step of, after the holding step, imaging the top surface side of the workpiece through the holding member by the first imaging unit positioned in a region that is on a lower side of the holding member and is not superimposed on the supporting member, and identifying a region to be processed in the workpiece, and wherein the first imaging unit is located between the lower side of the holding member and an upper side of an X-axis moving table;
a processing step of, after the identifying step, forming a processed groove along the region to be processed, on an undersurface side of the workpiece by the processing unit;
a detecting step of, after the processing step, imaging the processed groove on the workpiece by the second imaging unit positioned on an upper side of the holding member, and detecting a difference between a central position in a width direction of the region to be processed and a central position in a width direction of the processed groove; and
a position correcting step of correcting the position to be processed by the processing unit, on a basis of the difference between the central position of the region to be processed and the central position of the processed groove.

2. The workpiece processing method according to claim 1, wherein the central position of the region to be processed is the central distance between two adjacent devices formed on the top surface side of the workpiece.

3. The workpiece processing method according to claim 2, wherein each of the devices comprises an integrated circuit.

4. The workpiece processing method according to claim 2, wherein each of the devices comprises a large scale integration.

5. The workpiece processing method according to claim 2, wherein each of the devices comprises a light emitting diode.

6. A workpiece processing method for processing a workpiece by using a processing apparatus,
the processing apparatus including:
a chuck table configured to hold the workpiece by a holding surface,
a processing unit configured to process the workpiece held by the chuck table,
a moving mechanism configured to move the chuck table relative to the processing unit along a direction parallel with the holding surface of the chuck table,
an angle control mechanism disposed on the moving mechanism and on a lower side of the chuck table, the angle control mechanism controlling an angle of the chuck table, and
a first imaging unit and a second imaging unit configured to image the workpiece held by the chuck table,
the chuck table including a holding member formed by a transparent body and holding the workpiece and a supporting member supporting a part of the holding member and connected to the angle control mechanism, the workpiece processing method comprising:
- a holding step of holding the workpiece by the chuck table such that a top surface side of the workpiece is opposed to an upper surface of the holding member;
- an identifying step of, after the holding step, imaging the top surface side of the workpiece through the holding member by the first imaging unit positioned in a region that is on a lower side of the holding member, and identifying a region to be processed in the workpiece, and wherein the first imaging unit is located between the lower side of the holding member and an upper side of an X-axis moving table;
- a processing step of, after the identifying step, forming a processed groove along the region to be processed, on an undersurface side of the workpiece by the processing unit;
- a detecting step of, after the processing step, imaging the processed groove on the workpiece by the second imaging unit positioned on an upper side of the holding member, and detecting a difference between the region to be processed based on an image from the first imaging unit and the processed groove based on an image from the second imaging unit; and
- a position correcting step of correcting the position to be processed by the processing unit, on a basis of the difference between the region to be processed and the processed groove.

7. The workpiece processing method according to claim 6, wherein the detecting step includes detecting a difference between a central position in a width direction of the region to be processed based on the image from the first imaging unit and a central position in a width direction of the processed groove based on the image from the second imaging unit.

8. The workpiece processing method according to claim 7, wherein the position correcting step includes correcting the position to be processed by the processing unit on a basis of the difference between the central position of the region to be processed and the central position of the processed groove.

9. The workpiece processing method according to claim 8, wherein the central position of the region to be processed is the central distance between two adjacent devices formed on the top surface of the workpiece.

10. The workpiece processing method according to claim 9, wherein each of the devices comprises an integrated circuit.

11. The workpiece processing method according to claim 9, wherein each of the devices comprises a large scale integration.

12. The workpiece processing method according to claim 9, wherein each of the devices comprises a light emitting diode.

13. The workpiece processing method according to claim 1, wherein:
- the processing apparatus is configured and arranged such that the chuck table is moved by the moving mechanism and the first imaging unit images the workpiece through the holding member, during the identifying step, in a state in which the first imaging unit is positioned in a region that is on a lower side of the holding member and is not superimposed on the supporting member, and
- the first imaging unit is mounted upon a supporting arm that is configured and arranged to be moved in a Z-direction.

14. The workpiece processing method according to claim 13, wherein the supporting arm is configured and arranged to be moved in the Z-direction along a pair of Z-axis guide rails.

15. The workpiece processing method according to claim 14, wherein the processing apparatus further comprises a base and a supporting structure that extends in the upward direction from the base, and further wherein the pair of Z-guide rails are mounted to a side surface of the supporting structure.

16. The workpiece processing method according to claim 6, wherein:
- the processing apparatus is configured and arranged such that the chuck table is moved by the moving mechanism and the first imaging unit images the workpiece through the holding member, during the identifying step, in a state in which the first imaging unit is positioned in a region that is on a lower side of the holding member and is not superimposed on the supporting member, and
- the first imaging unit is mounted upon a supporting arm that is configured and arranged to be moved in a Z-direction.

17. The workpiece processing method according to claim 16, wherein the supporting arm is configured and arranged to be moved in the Z-direction along a pair of Z-axis guide rails.

18. The workpiece processing method according to claim 17, wherein the processing apparatus further comprises a base and a supporting structure that extends in the upward direction from the base, and further wherein the pair of Z-guide rails are mounted to a side surface of the supporting structure.

* * * * *